United States Patent
Koli (10) Patent No.: US 9,094,040 B2
(45) Date of Patent: Jul. 28, 2015

(54) CONTINUOUS-TIME MASH SIGMA-DELTA ANALOGUE TO DIGITAL CONVERSION

(71) Applicant: ST-Ericsson SA, Plan-les-Ouates (CH)

(72) Inventor: Kimmo Koli, Turku (FI)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/368,040

(22) PCT Filed: Dec. 29, 2012

(86) PCT No.: PCT/EP2012/076342
§ 371 (c)(1),
(2) Date: Jun. 23, 2014

(87) PCT Pub. No.: WO2013/098181

PCT Pub. Date: Jul. 4, 2013

(65) Prior Publication Data

US 2014/0368368 A1 Dec. 18, 2014

Related U.S. Application Data

(60) Provisional application No. 61/597,302, filed on Feb. 10, 2012.

(30) Foreign Application Priority Data

Dec. 29, 2011 (EP) ..................................... 11196128

(51) Int. Cl.
*H03M 3/00* (2006.01)
*H03M 1/06* (2006.01)

(52) U.S. Cl.
CPC ............... *H03M 3/462* (2013.01); *H03M 1/06* (2013.01); *H03M 3/436* (2013.01); *H03M 3/496* (2013.01); *H03M 3/394* (2013.01); *H03M 3/414* (2013.01)

(58) Field of Classification Search
CPC ..... H03M 3/454; H03M 3/436; H03M 3/496; H03M 7/3042; H03M 3/30; H03M 3/418; H03M 3/462; H03M 7/3022; H03M 1/0668; H03M 1/74; H03M 3/404; H03M 3/416; H03M 3/424; H03M 3/452; H03M 3/464; H03M 3/502
USPC .................................................. 341/143, 155
See application file for complete search history.

(56) References Cited

U.S. PATENT DOCUMENTS

| | | | | |
|---|---|---|---|---|
| 5,949,361 | A * | 9/1999 | Fischer et al. | 341/143 |
| 7,414,557 | B2 * | 8/2008 | Andersson et al. | 341/143 |
| 7,460,046 | B2 * | 12/2008 | Di Giandomenico et al. | 341/143 |
| 7,852,249 | B2 * | 12/2010 | Oliaei | 341/143 |
| 7,880,654 | B2 * | 2/2011 | Oliaei et al. | 341/143 |
| 8,223,051 | B2 * | 7/2012 | Van Veldhoven | 341/143 |
| 2010/0245137 | A1 * | 9/2010 | Azadet et al. | 341/118 |
| 2010/0328125 | A1 * | 12/2010 | Pagnanelli | 341/143 |

* cited by examiner

OTHER PUBLICATIONS

International Search Report issued in corresponding International application No. PCT/EP2012/076342, date of mailing Mar. 20, 2013.
Written Opinion of the International Searching Authority issued in corresponding International application No. PCT/EP2012/076342, date of mailing Mar. 20, 2013.
Keller, Matthias et al., "A Comparative Study on Excess-Loop-Delay Compensation Techniques for Continuous-Time Sigma-Delta Modulators," IEEE Transactions on Circuits and Systems I: Regular Papers, vol. 55, No. 11, Dec. 1, 2008, pp. 3480-3487, XP011333313; ISSN: 1549-8328; DOI: 10.1109/TCSI.2008.925362.
Feldman, Arnold R. et al.,"A 13 bit, 1.4 MS/s, 3.3V Sigma-Delta Modulator for RF Baseband Channel Application," 1998 Proceedings of the IEEE Custom Integrated Circuits Conference, Santa Clara, CA, USA, May 11-14, 1998, pp. 229-232, XP01029401; DOI: 10.1109/CICC.1998.694969; ISBN: 978-0-7803-4292-7.

*Primary Examiner* — Jean B Jeanglaude (74) *Attorney, Agent, or Firm* — Patent Portfolio Builders PLLC (57) ABSTRACT

A continuous-time MASH sigma-delta analogue-to-digital converter ADC. The ADC may include first and second modulators and an output stage. The ADC may be provided with a first modulator with 1.5 bit and a second modulator with 1 bit each receiving also the feedback from the other modulator. Sampling is at higher rate at the second modulator and decimation is performed before summing its output to the output of the first modulator.

16 Claims, 6 Drawing Sheets

CONTINUOUS-TIME MASH SIGMA-DELTA ANALOGUE TO DIGITAL CONVERSION

FIELD OF THE DISCLOSURE

The present disclosure relates to an analogue-to-digital converter, a wireless communication device comprising the analogue-to-digital converter, and a method of analogue-to-digital conversion.

BACKGROUND TO THE DISCLOSURE

Analogue-to-digital converters providing multi-stage noise-shaping, known as MASH, by employing cascaded delta-sigma ($\Delta\Sigma$) modulators are efficient and scalable when implemented using discrete-time switched-capacitor circuits. Such analogue-to-digital converters are very useful for cellular receivers which are required to support both a narrowband standard, such as Global System for Mobile Communication (GSM), and a wideband standard, such as the Third Generation Partnership Project Long Term Evolution (3GPP LTE), also known as LTE, with small circuit footprint and high energy efficiency.

By using continuous-time circuits, rather than discrete-time switched-capacitor circuits, analogue baseband filtering can be relaxed in cellular receivers and, in measurement receivers, no separate analogue baseband filter block may be required. However, a separate noise cancellation filter is required in the digital domain with the MASH scheme, and the use of such a noise cancellation filter requires matching of analogue and digital domain transfer functions. This matching is difficult to maintain in continuous-time circuits without calibration against process variation and temperature drift.

Therefore, there is a requirement for an improved analogue-to-digital converter and method of analogue-to-digital conversion.

SUMMARY OF THE PREFERRED EMBODIMENTS

According to a first aspect, there is provided a analogue-to-digital converter, ADC, comprising:

a first continuous-time, CT, delta-sigma, $\Delta\Sigma$, modulator comprising a first analogue stage arranged to generate a first error signal dependent on an input signal, a first feedback signal and a second feedback signal, a first quantiser arranged to generate a first quantised signal by quantising the first error signal into at least three levels at a first sample rate, and a first digital-to-analogue converter, DAC, arranged to generate the first feedback signal from the first quantised signal;

a second, first order CT $\Delta\Sigma$ modulator comprising a second analogue stage arranged to generate a second error signal dependent on the first error signal, the first feedback signal and the second feedback signal, a second quantiser arranged to generate a second quantised signal by quantising the second error signal into two levels at a second sample rate, and a second DAC arranged to generate the second feedback signal from the second quantised signal; and an output stage arranged to generate an output signal by summing the first quantised signal and the second quantised signal.

According to a second aspect, there is provided a method of analogue-to-digital conversion, comprising, in a first continuous-time, CT, delta-sigma, $\Delta\Sigma$, modulator: generating a first error signal dependent on an input signal, a first analogue feedback signal and a second analogue feedback signal, generating a first quantised signal by quantising the first error signal into at least three levels at a first sample rate, and generating the first analogue feedback signal from the first quantised signal;

in a second, first order CT $\Delta\Sigma$ modulator: generating a second error signal dependent on the first error signal, the first analogue feedback signal and the second analogue feedback signal, generating a second quantised signal by quantising the second error signal into two levels at a second sample rate, and generating the second analogue feedback signal from the second quantised signal; and generating an output signal by summing the first quantised signal and the second quantised signal.

The ADC may comprise, therefore, a cascade of two CT $\Delta\Sigma$-modulators where a first, or main, CT $\Delta\Sigma$-modulator employs multi-bit quantisation and a second, or cascade, CT $\Delta\Sigma$-modulator is a first order modulator with 1-bit quantisation. The multi-bit first quantised signal generated by the first CT $\Delta\Sigma$-modulator may be summed with the 1-bit second quantised signal generated by the second CT $\Delta\Sigma$-modulator to form the ADC output signal and the first feedback signal for the first CT $\Delta\Sigma$-modulator. The first CT $\Delta\Sigma$-modulator may be of any order, that is, first or higher order. In embodiments where the first quantiser quantises into three levels, the first quantiser may be a 1.5-bit quantiser. The second CT $\Delta\Sigma$-modulator can follow a quantisation error of the first modulator continuously. These features enable the ADC to have a low complexity, in particular because a digital noise cancelling filter may not be required and because matching of analogue and digital transfer functions may not be required. The ADC can also have a relaxed linearity requirement for the first DAC, which generates the first feedback signal, because the error feedback loop from the second CT $\Delta\Sigma$-modulator to the first CT $\Delta\Sigma$-modulator can be inherently linear due to the use of the two-level, that is, 1-bit, quantisation. The 1-bit quantisation of the second quantiser can relax the requirements for dynamic element matching techniques in the first, multi-bit DAC to compensate for nonlinearity, although with three level quantisation in the first quantiser, the need for dynamic element matching can be eliminated.

The second sample rate may be higher than the first sample rate and the output stage may comprise a decimation filter for converting the second sample rate of the second quantised signal to equal the first sample rate, prior to summing the first quantised signal and the second quantised signal. Likewise, the method may comprise the second sample rate being higher than the first sample rate and converting the second sample rate of the second quantised signal to equal the first sample rate, prior to summing the first quantised signal and the second quantised signal. With the second sample rate higher than the first sample rate, noise shaping by the ADC can be improved. The second sample rate may be, for example, an integer multiple of the first sample rate, enabling low complexity. Such a feature would be impossible in a discrete-time switched-capacitor implementation of an ADC because sampling is performed at the first modulator input. This feature can reduce the impact of excess delay in the feedback loop of the first CT $\Delta\Sigma$-modulator, relative to the delay in the feedback loop of the second CT $\Delta\Sigma$-modulator. In addition, improved energy efficiency can be provided with a wide conversion bandwidth because the second CT $\Delta\Sigma$-modulator can operate at a slower sample rate than the simple, 1-bit second CT $\Delta\Sigma$-modulator.

The second sample rate may be selectable from a plurality of different rates, at least one of which is higher than the first sample rate, and the output stage may comprise a decimation filter for converting the second sample rate of the second quantised signal higher than the first sample rate to equal the first sample rate, prior to summing the first quantised signal and the second quantised signal. Likewise, the method may comprise selecting the second sample rate from a plurality of different rates, at least one of which is higher than the first sample rate, and converting the second sample rate of the second quantised signal higher than the first sample rate to equal the first sample rate, prior to summing the first quantised signal and the second quantised signal. Again, with the second sample rate higher than the first sample rate, noise shaping by the ADC can be improved, and the second sample rate may be, for example, an integer multiple of the first sample rate, for low complexity. By means of the second sample rate selectable from a plurality of different rates, the dynamic range of the ADC can be scaled, for example by tens of decibels, without changing the signal transfer function of the ADC, thereby simplifying receiver design by relaxing receiver gain budget balancing. Such a feature facilitates reuse of existing CT $\Delta\Sigma$-modulator designs. For example, an ADC converter designed for use in a Wideband Code Division Multiple Access (WDCMDA) system can be used as a basis for the first CT $\Delta\Sigma$-modulator of an ADC for use in an LTE system.

The output stage may be arranged to scale at least one of the first quantised signal and the second quantised signal. Likewise, the method may comprise, scaling at least one of the first quantised signal and the second quantised signal. This provides a simple way of matching the digital domains of the first and second CT $\Delta\Sigma$-modulators.

The first CT $\Delta\Sigma$ modulator may have an order selectable from a plurality of different values. Likewise, the method may comprise selecting an order of the first CT $\Delta\Sigma$ modulator from a plurality of different values. For example, the selectable order may be one of: first order, second order, third order and fourth order. This feature enables a low order to be used for maximum power saving, and a higher order to be used when additional filtering is required. It also enables the ADC to be used in multiple modes, for example, a GSM mode, a WCDMA mode and an LTE mode.

The first analogue stage may comprise a first differencing stage arranged to generate a first difference signal by subtracting the first and second feedback signals from the input signal, and a first filter arranged to generate the first error signal by filtering the first difference signal. Likewise, the method may comprise generating a first difference signal by subtracting the first and second feedback signals from the input signal, and generating the first error signal by filtering the first difference signal. Therefore, the first difference signal can track the quantisation error of both the first and the second CT $\Delta\Sigma$-modulators.

In one embodiment, the first filter may comprise a first integrator coupled to an output of the first differencing stage to receive the first difference signal, a subtraction stage coupled to an output of the first integrator to receive a first intermediate signal and arranged to generate a second intermediate signal by subtracting the first and second feedback signals from the first intermediate signal, and a second integrator coupled to an output of the subtraction stage and arranged to generate the first error signal from the second intermediate signal. In this arrangement the second CT $\Delta\Sigma$-modulator is of second order, and provides a versatile compromise between complexity and filtering. Likewise, the method may comprise generating a first intermediate signal by integrating the first difference signal, generating a second intermediate signal by subtracting the first and second feedback signals from the first intermediate signal, and generating the first error signal by integrating the second intermediate signal.

In this embodiment, the first analogue stage may be arranged to scale at least one of the input signal, the first feedback signal, the second feedback signal and the first intermediate signal. Likewise, the method may comprise scaling at least one of the input signal, the first feedback signal, the second feedback signal and the first intermediate signal. This can facilitate matching of signals in the ADC, such as matching the ratio of the first and second feedback signals to the ratio of the first and second quantised signals.

In another embodiment, the first filter may comprise a first integrator coupled to an output of the first differencing stage to receive the first difference signal, a second integrator coupled to an output of the first integrator to receive a first intermediate signal, and a first summing stage having a first input coupled to the output of the first integrator, a second input coupled to an output of the second integrator, and an output for delivering the first error signal. Likewise, the method may comprise generating a first intermediate signal by integrating the first difference signal, integrating the first intermediate signal, and generating the first error signal by summing the first intermediate signal and the integrated first intermediate signal. Therefore, the first CT $\Delta\Sigma$-modulator can be provided with one or more feedforward paths, which can improve noise shaping and linearity.

In this embodiment, the first analogue stage may be arranged to scale at least one of the input signal, the first feedback signal, the second feedback signal and the first intermediate signal. Likewise, the method may comprise scaling at least one of the input signal, the first feedback signal, the second feedback signal and the first intermediate signal. This can facilitate matching of signals in the ADC, such as matching the ratio of the first and second feedback signals to the ratio of the first and second quantised signals.

In a further embodiment, the first filter may comprise a first integrator coupled to an output of the first differencing stage to receive the first difference signal, a second summing stage having a first input coupled to an output of the first integrator to receive a first intermediate signal and a second input coupled to an output of the second analogue stage to receive the second error signal, a second integrator coupled to an output of the second summing stage to receive a second intermediate signal, and a first summing stage having a first input coupled to the output of the first integrator, a second input coupled to an output of the second integrator, and an output for delivering the first error signal.

Likewise, the method may comprise generating a first intermediate signal by integrating the first difference signal, generating a second intermediate signal by summing the first intermediate signal and the second error signal, integrating the second intermediate signal, and generating the first error signal by summing the first intermediate signal and the integrated second intermediate signal. In this way, a notch can be provided in the frequency response of the ADC by providing a feedback path from the second CT $\Delta\Sigma$-modulator to the first analogue stage, which can optimise the signal-to-noise ratio, particularly for higher bandwidths, without altering the maximum allowed range of the input signal level.

In this embodiment, the first analogue stage may be arranged to scale at least one of the input signal, the first feedback signal, the second feedback signal, the first intermediate signal and the second error signal. Likewise, the method may comprise scaling at least one of the input signal, the first feedback signal, the second feedback signal, the first intermediate signal and the second error signal. This facilitates matching of the analogue domains of the first and second CT $\Delta\Sigma$-modulators.

The second analogue stage may comprise a second differencing stage arranged to generate a second difference signal by subtracting the first and second feedback signals from the first error signal, and a second filter arranged to generate the second error signal by integrating the second difference signal. Likewise, the method may comprise generating a second difference signal by subtracting the first and second feedback signals from the first error signal, and generating the second error signal by integrating the second difference signal. In this way, the second CT ΔΣ-modulator can track the quantisation error of the first CT ΔΣ-modulator.

There is also provided a wireless communication device comprising the ADC.

BRIEF DESCRIPTION OF THE DRAWINGS

Preferred embodiments will now be described, by way of example only, with reference to the accompanying drawings, in which.

DETAILED DESCRIPTION OF PREFERRED EMBODIMENTS

Figure 1:
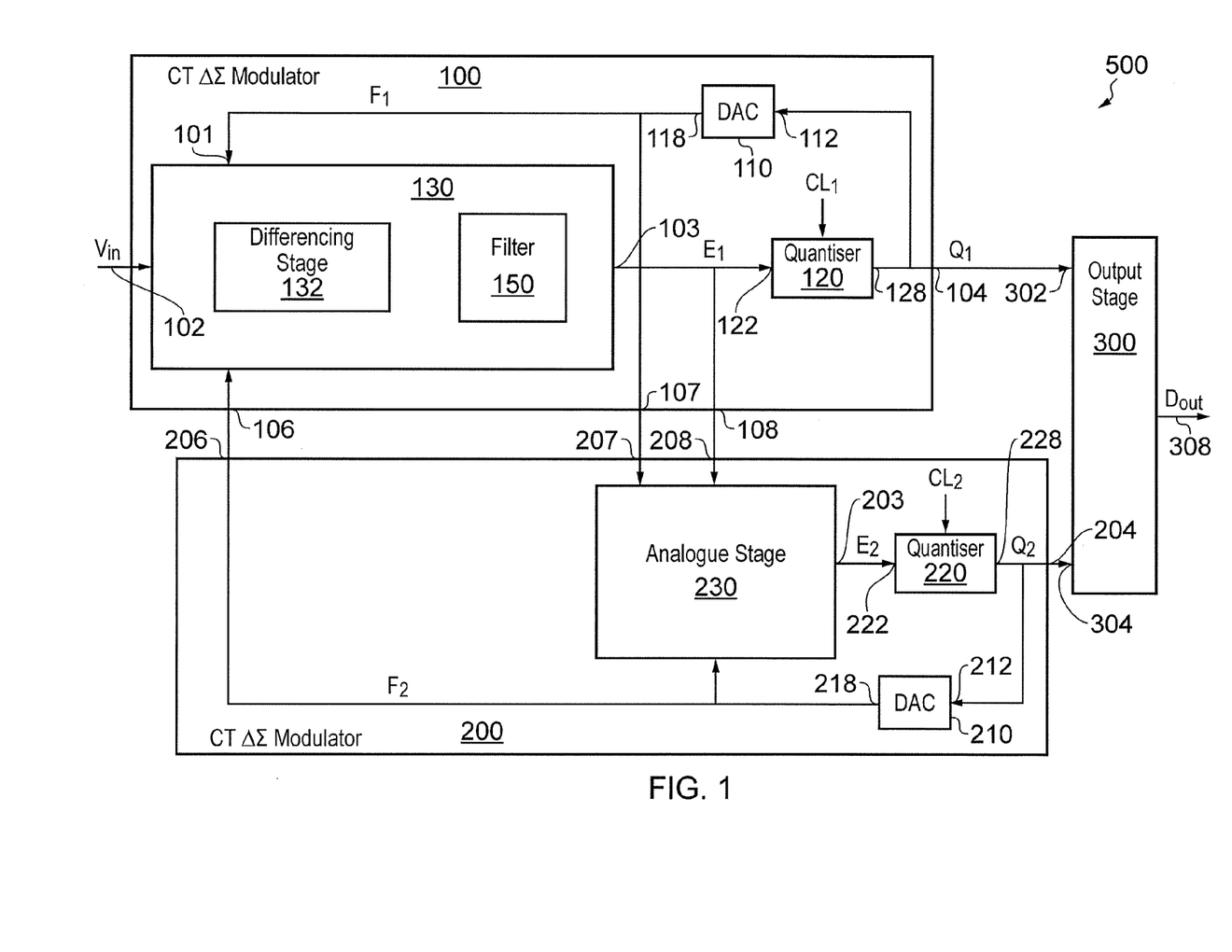
FIG. 1 is a block diagram of an ADC.

Referring to FIG. 1, an ADC 500 comprises a first CT ΔΣ-modulator 100, a second CT ΔΣ-modulator 200, and an output stage 300. The first CT ΔΣ-modulator 100 comprises a first analogue stage 130, a first quantisation stage 120 and a first DAC 110 coupled in a loop. A first input 102 of the ADC 500, for receiving an input signal $V_{in}$, which is an analogue signal, is coupled to a first input of the first analogue stage 130. A second input 101 of the first analogue stage 130 receives a first feedback signal $F_1$, which is generated internally to the first CT ΔΣ-modulator 100, and a third input of the first analogue stage 130 receives a second feedback signal $F_2$ from the second CT ΔΣ-modulator 200 via a second input 106 of the first CT ΔΣ-modulator 100. The first analogue stage 130, by means of a first differencing stage 132 and a first filter 150, both of which are described in more detail below, generates a first error signal $E_1$ which is delivered at an output 103 of the first analogue stage 130.

The output 103 of the first analogue stage 130 is coupled to a first input 122 of the first quantiser 120. A second input of the first quantiser 120 receives a first clock signal $CL_1$. In response to the first clock signal $CL_1$, the first quantiser 120 samples and quantises the first error signal $E_1$ at a first sample rate, which is the frequency of the first clock signal $CL_1$, and an output 128 of the first quantiser 120 is coupled to a first output 104 of the first CT ΔΣ-modulator 100 for delivering the quantised samples of the first error signal $E_1$ to the output stage 300. For quantising the first error signal $E_1$, the first quantiser 120 employs at least two threshold levels, and therefore, the quantised samples of the first error signal $E_1$ can have any of at least three values, also referred to as quantisation levels. Three-level quantisation corresponds to 1.5-bit quantisation. Alternatively, for example, the use of three threshold levels for quantisation results in the first error signal $E_1$ having four quantisation levels, corresponding to 2-bit quantisation. In this way, the first quantiser 120 converts the first error signal $E_1$ from the analogue domain to the digital domain.

The output 128 of the first quantiser 120 is also coupled to an input 112 of the first DAC 110 which converts the quantised first error signal $E_1$ from the digital domain to the analogue domain as the first feedback signal $F_1$. An output 118 of the first DAC 110 is coupled to the second input 101 of the first analogue stage 130 for delivering the first feedback signal $F_1$ to the first analogue stage 130.

The output 103 of the first analogue stage 130 is coupled to a second output 108 of the first CT ΔΣ-modulator 100 for delivering the first error signal $E_1$ to the second CT ΔΣ-modulator 200. The output 118 of the first DAC 110 is also coupled to a third output 107 of the first CT ΔΣ-modulator 100 for delivering the first feedback signal $F_1$ to the second CT ΔΣ-modulator 200.

The second CT ΔΣ-modulator 200 comprises a second analogue stage 230, a second quantisation stage 220 and a second DAC 210 coupled in a loop. A first input 208 of the second CT ΔΣ-modulator 200 is coupled to the second output 108 of the first CT ΔΣ-modulator 100 for receiving the first error signal $E_1$, and is coupled to a first input of the second analogue stage 230 for delivering the first error signal $E_1$ to the second analogue stage 230. A second input 207 of the second CT ΔΣ-modulator 200 is coupled to the third output 107 of the first CT ΔΣ-modulator 100 for receiving the first feedback signal $F_1$, and is coupled to a second input of the second analogue stage 230 for delivering the first feedback signal $F_1$ to the second analogue stage 230. A third input of the second analogue stage 230 receives the second feedback signal $F_2$, which is generated internally to the second CT ΔΣ-modulator 200. The second analogue stage 230, which is described in more detail below, generates a second error signal $E_2$ which is delivered at an output 203 of the second analogue stage 230.

The output 203 of the second analogue stage 230 is coupled to a first input 222 of the second quantiser 220. A second input of the second quantiser 220 receives a second clock signal $CL_2$. In response to the second clock signal $CL_2$, the second quantiser 220 samples and quantises the second error signal $E_2$ at a second sample rate, which is the frequency of the second clock signal $CL_2$, and an output 228 of the second quantiser 220 is coupled to a first output 204 of the second CT ΔΣ-modulator 200 for delivering the quantised samples of the second error signal $E_2$ to the output stage 300. For quantising the second error signal $E_2$, the second quantiser 220 employs only one threshold level, and therefore, the quantised samples of the second error signal $E_2$ can have either of only two values, also referred to as quantisation levels. Two-level quantisation corresponds to 1-bit quantisation. In this way, the first quantiser 120 converts the second error signal $E_2$ from the analogue domain to the digital domain.

The frequency of the first and second clock signals $CL_1$, $CL_2$ may be equal, in which case the first and second sample rates are equal, or the second clock signal $CL_2$ may have a frequency higher than the frequency of the first clock signal $CL_1$, in which case the second sample rate is higher than the first sample rate. In general, the second sample rate may be K times the first sample rate, that is, $CL_2=K.CL_1$, where K is a constant not less than unity. Conveniently, K may be an integer, and in particular a power of two.

The output 228 of the second quantiser 220 is coupled to an input 212 of the second DAC 210 which converts the quantised second error signal $E_2$ from the digital domain to the analogue domain as the second feedback signal $F_2$. An output 218 of the second DAC 210 is coupled to the third input of the second analogue stage 230 for delivering the second feedback signal $F_2$ to the second analogue stage 230, and is coupled to a second output 206 of the second CT ΔΣ-modulator 200 for delivering the second feedback signal $F_2$ to the first CT ΔΣ-modulator 100. The second output 206 of the second CT ΔΣ-modulator 200 is coupled to the second input 106 of the first CT ΔΣ-modulator 100.

The output stage 300 comprises a first input 302 coupled to the first output 104 of the first CT ΔΣ-modulator 100 for receiving the quantised first error signal $E_1$, alternatively referred to as the first quantised signal $Q_1$, and a second input 304 coupled to the first output 204 of the second CT ΔΣ-modulator 200 for receiving the quantised second error signal $E_2$, alternatively referred to as the second quantised signal $Q_2$. The output stage 300 sums in the digital domain, the first and second quantised signals $Q_1$, $Q_2$, and delivers the sum at an output 308 of the ADC 500 as a digital output signal $D_{out}$, which is a multi-bit word.

Figure 2:
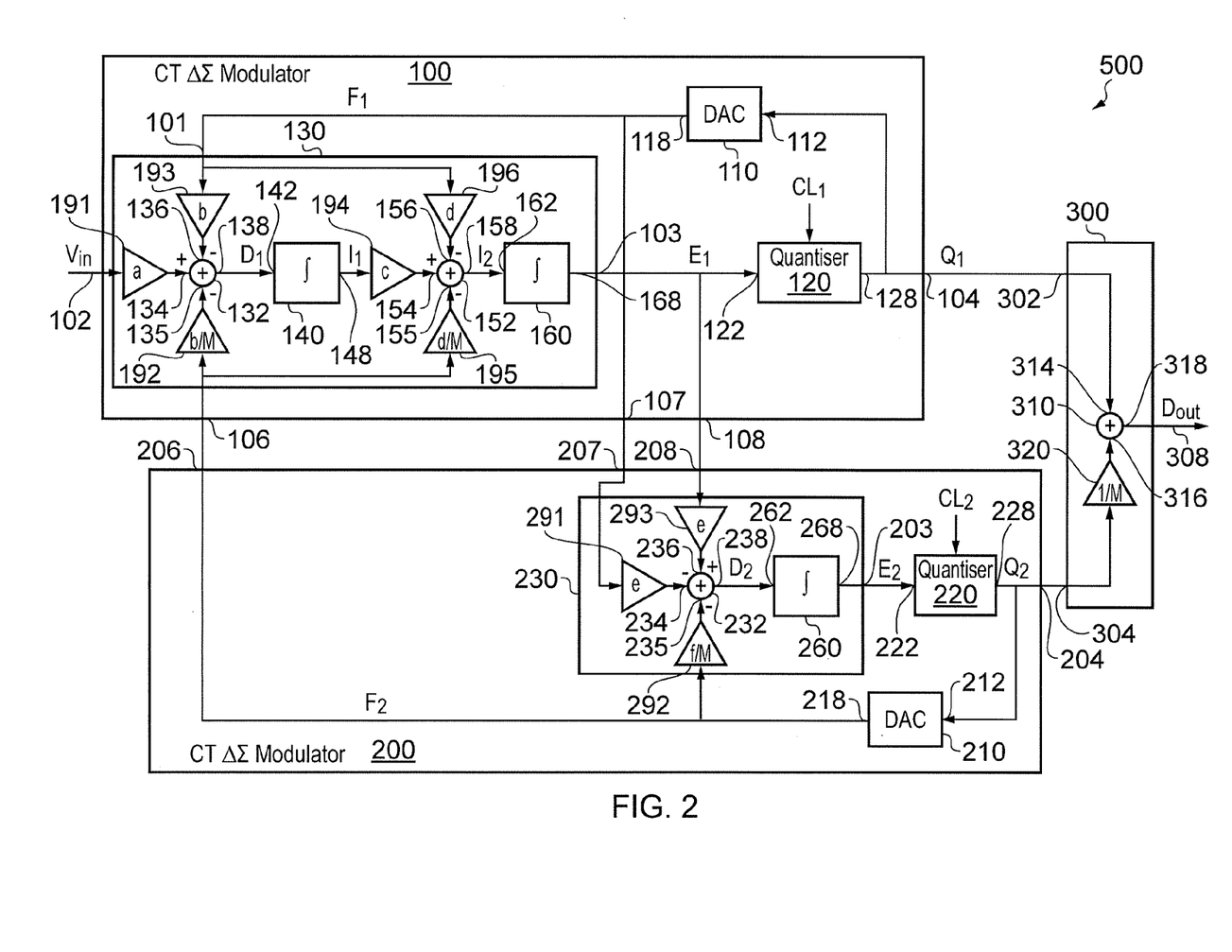
FIG. 2 is a block diagram showing more detail of a first embodiment of the ADC of FIG. 1.

Referring to FIG. 2, a first embodiment of the ADC 500 comprises each of the elements illustrated in FIG. 1, and these are not described again; only additional details are described below. The first analogue stage 130 comprises the first differencing stage 132 having a first, non-inverting input 134 coupled to the first input 102 of the ADC 500 by means of a first scaling stage 191 having a scale factor a. The first differencing stage 132 also has a second, inverting input 135 coupled to the second input 106 of the first CT ΔΣ-modulator 100 by means of a second scaling stage 192 having a scale factor b/M, for receiving the second feedback signal $F_2$, and a third, inverting input 136 coupled to the output 118 of the first DAC 110 by means of a third scaling stage 193 having a scale factor b, for receiving the first feedback signal $F_1$. The first differencing stage 132 generates a first difference signal $D_1$ by subtracting the first and second feedback signals $F_1$, $F_2$ from the input signal $V_{in}$, and delivers the first difference signal $D_1$ at an output 138 of the first differencing stage 132.

The output 138 of the first differencing stage 132 is coupled to an input 142 of a first integrator 140. The first integrator 140 generates a first intermediate signal $I_1$ by integrating the first difference signal $D_1$. The first intermediate signal $I_1$ is delivered at an output 148 of the first integrator 140 which is coupled to a first non-inverting input 154 of a subtraction stage 152 by means of a fourth scaling stage 194 having a scale factor c. A second, inverting input 155 of the subtraction stage 152 is coupled to the second input 106 of the first CT ΔΣ-modulator 100 by means of a fifth scaling stage 195 having a scale factor d/M, for receiving the second feedback signal $F_2$, and a third, inverting input 156 coupled to the output 118 of the first DAC 110 by means of a sixth scaling stage 196 having a scale factor d, for receiving the first feedback signal $F_1$. The subtraction stage 152 generates a second intermediate signal $I_2$ by subtracting the first and second feedback signals $F_1$, $F_2$ from the first intermediate signal $I_1$, and delivers the second intermediate signal $I_2$ at an output 158 of the subtraction stage 152.

The output 158 of the subtraction stage 152 is coupled to an input 162 of a second integrator 160. The second integrator 160 generates the first error signal $E_1$ by integrating the second intermediate signal $I_2$. The first error signal $E_1$ is delivered at an output 168 of the second integrator 160, which is coupled to the input 122 of the first quantiser 120 by means of the output 103 of the first analogue stage 130. The first and second integrators 140, 160 and the subtraction stage 152 together form the first filter 150.

Continuing to refer to FIG. 2, the second analogue stage 230 comprises a second differencing stage 232 having a first, inverting input 234 coupled to the second input 207 of the second CT ΔΣ-modulator 200 by means of a seventh scaling stage 291 having a scale factor e, for receiving the first feedback signal $F_1$. The second differencing stage 232 also has a second, inverting input 235 coupled to the output 218 of the second DAC 210 by means of an eighth scaling stage 292 having a scale factor f/M, for receiving the second feedback signal $F_2$, and a third, non-inverting input 236 coupled to the first input 208 of the second CT ΔΣ-modulator 200 by means of a ninth scaling stage 293 having a scaling factor e, for receiving the first error signal $E_1$. The second differencing stage 232 generates a second difference signal $D_2$ by subtracting the first and second feedback signals $F_1$, $F_2$ from the first error signal $E_1$, and delivers the second difference signal $D_2$ at an output 238 of the second differencing stage 232. The quantisation error of the first CT ΔΣ-modulator 100 is the difference between the first error signal $E_1$ and the first feedback signal $F_1$. This quantisation error is, in effect, used as an input signal to the second CT ΔΣ-modulator 200.

The output 238 of the second differencing stage 232 is coupled to an input 262 of a second filter 260. The second filter 260 generates a second error signal $E_2$ by integrating the second difference signal $D_2$. The second error signal $E_2$ is delivered at an output 268 of the second filter 260 which is coupled to the input 222 of the second quantiser 220 by means of the output 203 of the second analogue stage 230.

The output stage 300 comprises an output summing stage 310 having a first input 314 coupled to the first input 302 of the output stage 300 for receiving the first quantised signal $Q_1$, and a second input 316 coupled to the second input 304 of the output stage 300 by means of a tenth scaling stage 320 having a scale factor 1/M, for receiving the second quantised signal $Q_2$. The output summing stage 310 generates the output signal $D_{out}$ by summing the first and second quantised signals $Q_1$, $Q_2$, and delivers the output signal $D_{out}$ at an output 318 of the output summing stage 310 which is coupled to the output 308 of the ADC 500.

In the digital domain, the second quantised signal $Q_2$, from the second CT ΔΣ-modulator 200, is scaled down by a factor M by the tenth scaling stage 320 and summed with the first quantised signal $Q_1$, from the first CT ΔΣ-modulator 100, in the output stage 300. The first quantised signal $Q_1$ may optionally also be scaled by a further, non-illustrated, scaling stage. Similarly, in the analogue domain, the second feedback signal $F_2$ is scaled down by the factor M by the second, fifth and eighth scaling stages 192, 195, 292 and is summed with the first feedback signal $F_1$ in the first and second differencing stages 132, 232 and the subtraction stage 152. Therefore, only the factor M of the second, fifth, eighth and tenth scaling stages 192, 195, 292, 320 needs to be matched to match the analogue and digital domains. Therefore, there is no need to match s-domain analogue and z-domain digital transfer functions. Implementation of the factor M in the digital domain, in particular in the tenth scaling stage 320, may include provision for calibration in order to match the implementation of the factor M in the analogue domain, in particular in the second, fifth and eighth scaling stages 192, 195, 292. Furthermore, provision may be included for calibrating the second feedback signal $F_2$ fed back from the output 218 of the second DAC 210 to the second, fifth and eighth scaling stages 192, 195, 292.

Figure 3:
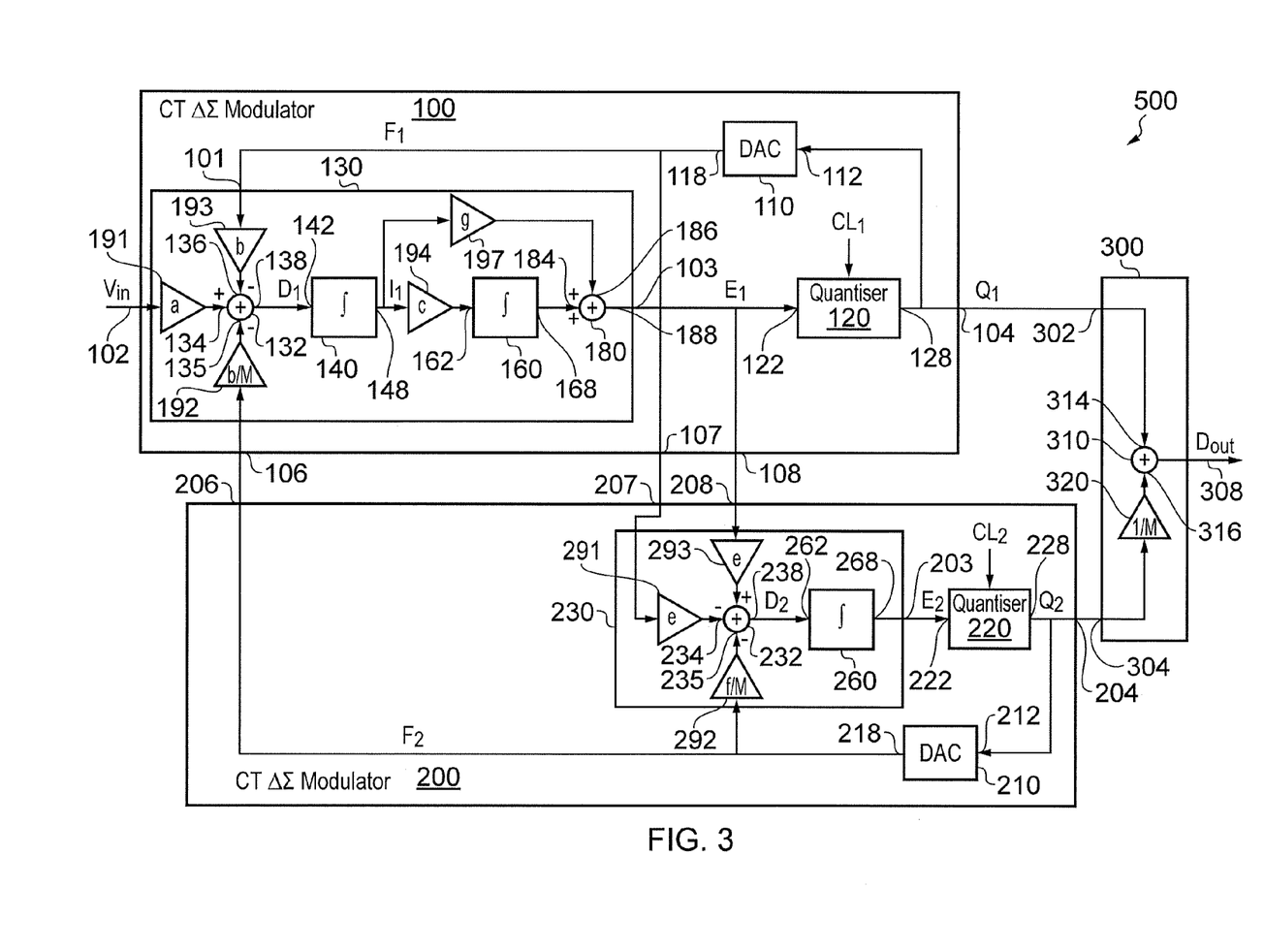
FIG. 3 is a block diagram showing more detail of a second embodiment of the ADC of FIG. 1.

Referring to FIG. 3, a second embodiment of the ADC 500 comprises each of the elements illustrated in FIG. 1, and these are not described again. Moreover, the second CT ΔΣ-modulator 200 and the output stage 300 illustrated in FIG. 3 are identical to the second CT ΔΣ-modulator 200 and the output stage 300 described with reference to FIG. 2, so these are not described again. Only the first analogue stage 130 of the embodiment illustrated in FIG. 3 differs from the first analogue stage 130 illustrated in FIG. 2, and this is described below.

The first analogue stage 130 of FIG. 3 comprises the first differencing stage 132 and the first scaling stage 191, second scaling stage 192 and the third scaling stage 193, for generating the first difference signal $D_1$, and the first integrator 140 for generating the first intermediate signal $I_1$, as described with reference to FIG. 2. The output 148 of the first integrator 140 is coupled to an input 162 of a second integrator 160 by means of the fourth scaling stage 194 having the scale factor c. A first summing stage 180 has a first non-inverting input 184 coupled to the output 168 of the second integrator, and a second non-inverting input 186 coupled to the output 148 of the first integrator 140 by means of an eleventh scaling stage 197 having a scale factor g. Optionally, the first summing stage 180 may have a further non-inverting input coupled to the first input 102 of the ADC 500 by means of a further scaling stage. The first summing stage 180 generates the first error signal $E_1$ by summing the first intermediate signal $I_1$ and the integrated first intermediate signal $I_1$ provided by the second integrator 160, and delivers the first error signal $E_1$ at an output 188 of the first summing stage 180, which is coupled to the input 122 of the first quantiser 120 by means of the output 103 of the first analogue stage 130. The first CT ΔΣ-modulator 100 illustrated in FIG. 3 is of second order and has a feedforward architecture. By using a feedforward architecture for the first CT ΔΣ-modulator 100, the subtraction of the first and second feedback signals $F_1$, $F_2$ from the first intermediate signal $I_1$ by the subtraction stage 152 of FIG. 2 is dispensed with. The feedforward architecture provides more efficient noise shaping than the feedback architecture employed by the first CT ΔΣ-modulator 100 of FIG. 2, and the first error signal $E_1$, first quantised signal $Q_1$ and the first feedback signal $F_1$ are mainly signal-independent quantisation noise, resulting in lower distortion. In addition, feeding back the second feedback signal $F_2$ from the second CT ΔΣ-modulator 200 to the first CT ΔΣ-modulator 100 having the feedforward architecture decreases the signal swing in the first CT ΔΣ-modulator 100, relative to the signal swing in the first CT ΔΣ-modulator 100 illustrated in FIG. 2, which has a feedback architecture. The ADC 500 illustrated in FIG. 3, therefore, can accommodate the input signal $V_{in}$ having a wider amplitude range.

The embodiments of the ADC 500 described with reference to FIGS. 2 and 3 both provide third order noise transfer functions, by cascading the first CT ΔΣ-modulator 100 having a second order and the second CT ΔΣ-modulator 200 having a first order. In order to maximise signal-to-noise ratio for higher bandwidths, a notch can be added to the transfer function by coupling the output 168 of the second integrator to an additional input on the first differencing stage 132 or to an additional summing stage coupled between the first differencing stage 132 and the first integrator 140 in the embodiments of FIGS. 2 and 3.

Figure 4:
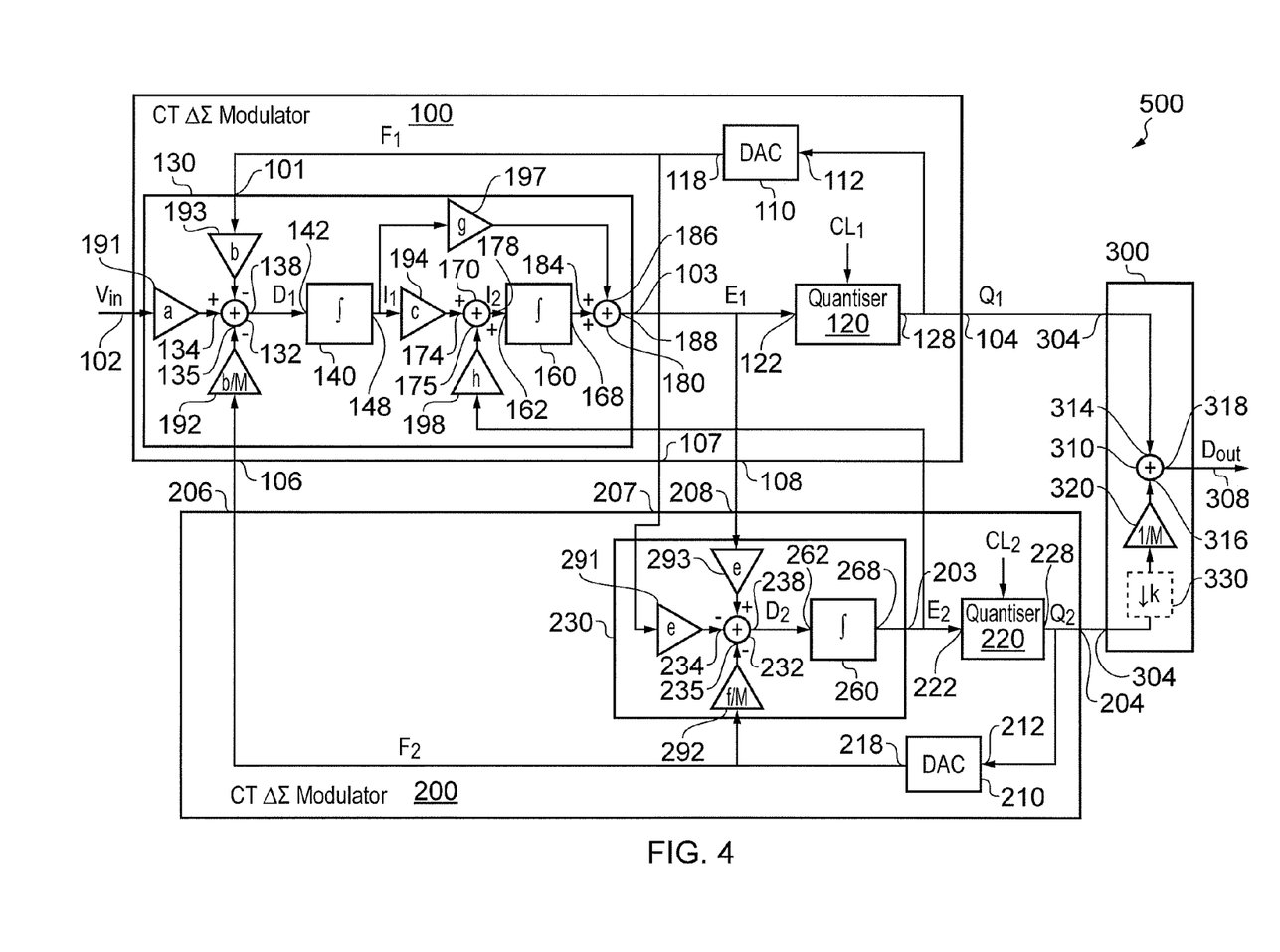
FIG. 4 is a block diagram showing more detail of a third embodiment of the ADC of FIG. 1.

In a third embodiment of the ADC 500 illustrated in FIG. 4, an alternative feedback path is provided. Referring to FIG. 4, a second summing stage 170 is coupled between the fourth scaling stage 194 and the second integrator 160 for adding the second error signal $E_2$ to the first intermediate signal $I_2$. In more detail, an output of the fourth scaling stage 194 is coupled to a first non-inverting input 174 of the second summing stage 170. The output 268 of the second filter 260 is coupled, via the output 203 of the second analogue stage 230, to a second non-inverting input 175 of the second summing stage 170 by means of a twelfth scaling stage 198 having a scale factor h. The second summing stage 170 generates a second intermediate signal $I_2$ by summing the first intermediate signal $I_1$ and the second error signal $E_2$, and an output 178 of the second summing stage 170 is coupled to the input 162 of the second integrator 160 for delivering the second intermediate signal $I_2$. This alternative feedback arrangement does not reduce the maximum signal amplitude that the ADC 500 can accommodate.

In all other respects, the architecture of the third embodiment of the ADC 500 illustrated in FIG. 4 is the same as the second embodiment of the ADC 500 described above with reference to FIG. 3, except for an optional decimation filter 330, illustrated with a broken line, coupled between the second input 304 of the output stage 300 and the tenth scaling stage 320. The optional decimation filter 330 may be employed in any of the described embodiments of the ADC 500 when the second sample rate is higher than the first sample rate, in order to reduce the sample rate of the second quantised signal $Q_2$ to equal the first sample rate, prior to the summing of the first and second quantised signals $Q_1$, $Q_2$ by the output summing stage 310. In some embodiments, the first quantisation signal $Q_1$ may also undergo decimation in a further decimation filter coupled between the input 304 of the output stage 300 and the output summing stage 310, but the sample rates of the first and second quantised signals $Q_1$, $Q_2$ are, nevertheless, made equal prior to the summing of the first and second quantised signals $Q_1$, $Q_2$ by the output summing stage 310.

Because the quantisation error of the first CT ΔΣ-modulator 100 which is delivered to the second CT ΔΣ-modulator 200, and which may be represented as $E_1-F_1$, or $e(E_1-F_1)$ after scaling by the seventh and ninth scaling stages 291, 293, is derived from the analogue input signal $V_{in}$, more information can be extracted by the cascaded second CT ΔΣ-modulator 200, compared with, for example, cascade ΔΣ-modulators which operate in discrete-time using switched-capacitors. Therefore, it is advantageous for the second sample rate to be higher than the first sample rate, for example an integer multiple K, and in particular K may be a power of two. If the second sample rate is double the first sample, that is, K=2, the signal-to-noise ratio of the ADC 500 can be increased by 9 dB, for an identical signal bandwidth. The decimation ratio of the decimation filter 330 is, correspondingly, also equal to K.

Furthermore, the frequency of the second clock signal $CL_2$, and consequently the second sample rate, may be variable. For example, the second sample rate may be selectable from a plurality of different rates by providing a set of values K=1, 2, 4 . . . , and a corresponding set of decimation ratios in the decimation filter 330. Increasing the second sample rate of the 1-bit first order second CT ΔΣ-modulator 200 does not impose a severe current consumption penalty and does not necessitate stringent accuracy requirements. Similarly, the decimation filter 330 is simple to implement because the second quantised signal $Q_2$ that it processes has a 1-bit depth.

Figure 5:
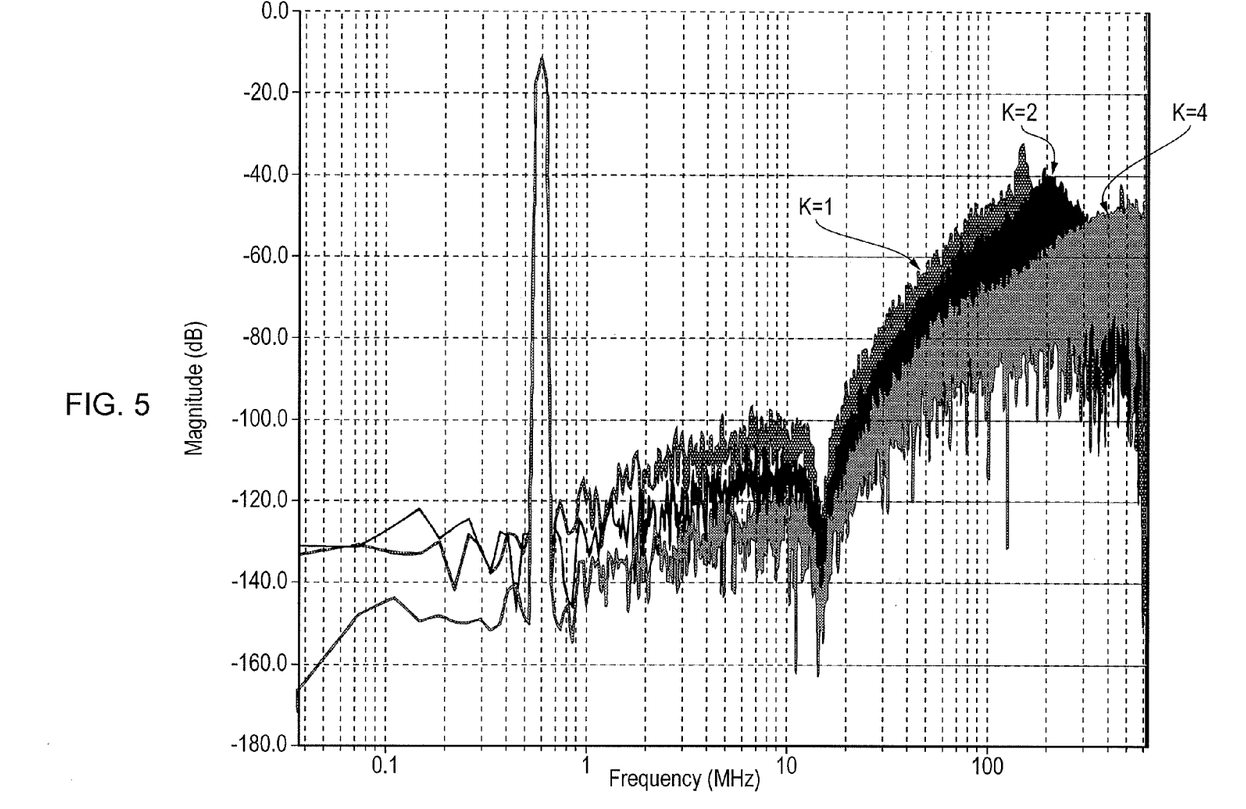
FIG. 5 is a graph of spectra of a digital output signal of the ADC using different sample rates.

Referring to FIG. 5, the spectrum of the digital output signal $D_{out}$ of the ADC 500 illustrated in FIG. 4 is shown for K=1, where the first and second sample rates are equal, for K=2, where the second sample rate is double the first sample rate, and for K=4, where the second sample rate is four times the first sample rate. In this example, for each value of K, the first sample rate is 624 MHz and a notch in the frequency response is placed to provide a bandwidth of 20 MHz. A reduction in wideband noise as the second sample rate is increased is apparent. For example, with a bandwidth of 20 MHz, the signal-to-noise-and-distortion radio is increased from 67.5 dB for K=1 to 76.8 dB for K=2 and to 86.7 dB for K=4, whilst the signal amplitude throughout the whole modulator is significantly reduced. The high frequency shape of the spectra indirectly shows that increasing the second sample rate of the second CT ΔΣ-modulator 200 reduces the effects of excess loop delay of the first CT ΔΣ-modulator 100.

The ADC 500 may be provided with a programmable architecture enable operation in a plurality of modes, with the mode being selected according to operational circumstances. For example, in a first mode the first CT ΔΣ-modulator 100 may be of first order, for use when maximum power saving is desired, in a second mode the first CT ΔΣ-modulator 100 may be of second order and the ADC 500 may provide a notch in its frequency response, in a third mode the first CT ΔΣ-modulator 100 may be of third order, using two feedforward stages, and the ADC 500 may provide a notch in its frequency response, and in a fourth mode the first CT ΔΣ-modulator 100 may be of fourth order, using three feedforward stages enabling two notches in the frequency response of the ADC 500, one in the first CT ΔΣ-modulator 100 and one across both the first and second CT ΔΣ-modulators 100, 200. For each of the modes, the first CT ΔΣ-modulator 100 may use 1.5-bit quantisation, and the second CT ΔΣ-modulator 200 may be of first order and use 1-bit quantisation. Such modes may be advantageous when, for example, the ADC 500 is required to operate in different mobile communications systems conforming to different standards, such as GSM, LTE, and WCDMA. Moreover, the first and second sample rate may be programmable, enabling these to be changed if a frequency spur occurs at an undesired frequency. For example, for use with LTE having a bandwidth at baseband of 10 MHz, the ADC 500 may operate in the second or third mode using a first and second sample rate of 624 MHz, or in the fourth mode using a first and second sample rate of 468 MHz, whilst for operation as a measurement receiver assisting a transmitter, operation in the second mode using a first and second sample rate of 624 MHz may be adequate where low pass filtering provided by the ADC 500 may be the only baseband filtering provided in the receiver chain. Increasing the second sample rate by the factor K can provide additional scope for reducing noise and increasing receiver sensitivity, according to operational circumstances.

Figure 6:
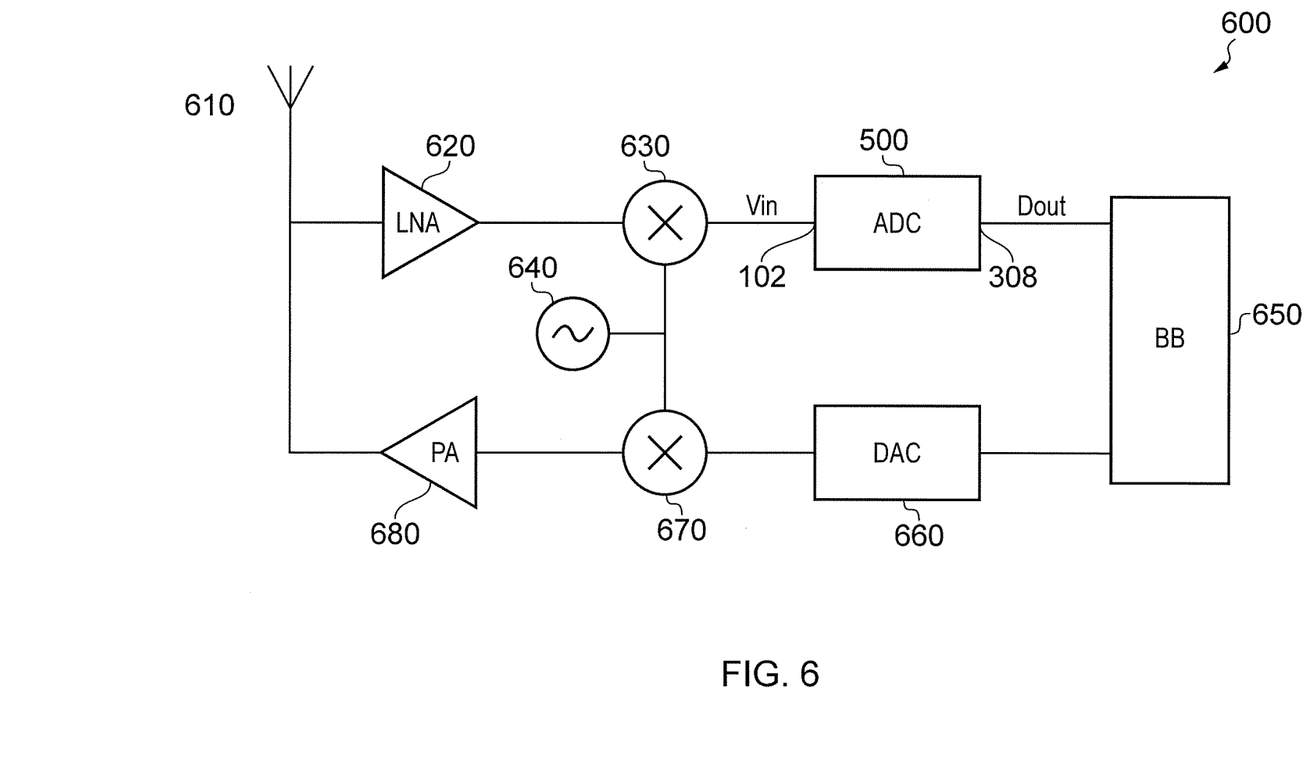
FIG. 6 is a block diagram of a wireless communication device comprising the ADC.

Referring to FIG. 6, a wireless communication device 600 comprises an antenna 610 coupled to an input of a low noise amplifier (LNA) 620. An output of the LNA 620 is coupled to a first input of a down-conversion mixer 630. An oscillator 640 is coupled to a second input of the down-conversion mixer 630 and delivers a local oscillator signal for down-converting a radio frequency signal received at the antenna 610. An output of the down-conversion mixer 630 is coupled to the input 102 of the ADC 500 for delivering the down-converted signal as the input signal $V_{in}$ to the ADC 500. The output 308 of the ADC 500 is coupled to an input of a baseband processor (BB) 650 for demodulating the digital output signal $D_{out}$ of the ADC 500. An output of the BB 650 is coupled to an input of a digital-to-analogue converter (DAC) 660 which converts to the analogue domain a digital signal generated by the BB 650. An output of the DAC 660 is coupled to a first input of an up-conversion mixer 670. The oscillator 640 is also coupled to a second input of the up-conversion mixer 670 for up-converting the analogue signal delivered from the DAC 660. An output of the up-conversion mixer 670 is coupled to an input of a power amplifier (PA) 680 for amplifying the up-converted signal, and an output of the PA 680 is coupled to the antenna 610 for transmission of the amplified signal.

Embodiments have been described in which an output of a single DAC is coupled to more than one scaling stage. For example, in the embodiment of FIG. 2, the output 118 of the first DAC 110 is coupled to the third scaling stage 193 and the sixth scaling stage 196, and the output 218 of the second DAC 210 is coupled to the second scaling stage 192 and the eighth scaling stage 292. In this case one, or each, of the first and second DACs 110, 210 may be implemented as a single DAC voltage circuit for delivering the first and/or second feedback signals $F_1$, $F_2$ to the plurality of scaling stages as a voltage by means of a plurality of resistors. Alternatively, one or each of the first and second DACs 110, 210 may be implemented as a plurality of DAC current circuits, with each of the DAC current circuits delivering the first or second feedback signal to a different one of the scaling stages as a current.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfill the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. An analogue-to-digital converter, ADC, comprising:
a first continuous-time, CT, delta-sigma, ΔΣ, modulator comprising a first analogue stage arranged to generate a first error signal dependent on an input signal, a first feedback signal and a second feedback signal, a first quantiser arranged to generate a first quantised signal by quantising the first error signal into at least three levels at a first sample rate, and a first digital-to-analogue converter, DAC, arranged to generate the first feedback signal from the first quantised signal;
a second, first order CT ΔΣ modulator comprising a second analogue stage arranged to generate a second error signal dependent on the first error signal, the first feedback signal and the second feedback signal, a second quantiser arranged to generate a second quantised signal by quantising the second error signal into two levels at a second sample rate, and a second DAC arranged to generate the second feedback signal from the second quantised signal; and
an output stage arranged to generate an output signal by summing the first quantised signal and the second quantised signal.

2. The ADC as claimed in claim 1, wherein the second sample rate is higher than the first sample rate and the output stage comprises a decimation filter for converting the second sample rate of the second quantised signal to equal the first sample rate, prior to summing the first quantised signal and the second quantised signal.

3. The ADC as claimed in claim 1, wherein the second sample rate is selectable from a plurality of different rates, at least one of which is higher than the first sample rate, and the output stage comprises a decimation filter for converting the second sample rate of the second quantised signal higher than the first sample rate to equal the first sample rate, prior to summing the first quantised signal and the second quantised signal.

4. The ADC as claimed in claim 1, wherein the output stage is arranged to scale at least one of the first quantised signal and the second quantised signal.

5. The ADC as claimed in claim 1, wherein the first CT ΔΣ modulator has an order selectable from a plurality of different values.

6. The ADC as claimed in claim 1, wherein the first analogue stage comprises a first differencing stage arranged to generate a first difference signal by subtracting the first and second feedback signals from the input signal, and a first filter arranged to generate the first error signal by filtering the first difference signal.

7. The ADC as claimed in claim 6, wherein the first filter comprises a first integrator coupled to an output of the first differencing stage to receive the first difference signal, a subtraction stage coupled to an output of the first integrator to receive a first intermediate signal and arranged to generate a second intermediate signal by subtracting the first and second feedback signals from the first intermediate signal, and a second integrator coupled to an output of the subtraction stage and arranged to generate the first error signal from the second intermediate signal.

8. The ADC as claimed in claim 7, wherein the first analogue stage is arranged to scale at least one of the input signal, the first feedback signal, the second feedback signal and the first intermediate signal.

9. The ADC as claimed in claim 6, wherein the first filter comprises a first integrator coupled to an output of the first differencing stage to receive the first difference signal, a second integrator coupled to an output of the first integrator to receive a first intermediate signal, and a first summing stage having a first input coupled to the output of the first integrator, a second input coupled to an output of the second integrator, and an output for delivering the first error signal.

10. The ADC as claimed in claim 9, wherein the first analogue stage is arranged to scale at least one of the input signal, the first feedback signal, the second feedback signal and the first intermediate signal.

11. The ADC as claimed in claim 6, wherein the first filter comprises a first integrator coupled to an output of the first differencing stage to receive the first difference signal, a second summing stage having a first input coupled to an output of the first integrator to receive a first intermediate signal and a second input coupled to an output of the second analogue stage to receive the second error signal, a second integrator coupled to an output of the second summing stage to receive a second intermediate signal, and a first summing stage having a first input coupled to the output of the first integrator, a second input coupled to an output of the second integrator, and an output for delivering the first error signal.

12. The ADC as claimed in claim 11, wherein the first analogue stage is arranged to scale at least one of the input signal, the first feedback signal, the second feedback signal, the first intermediate signal and the second error signal.

13. The ADC as claimed in claim 1, wherein the output stage is arranged to scale at least one of the first and second quantised signals.

14. The ADC as claimed in claim 1, wherein the second analogue stage comprises a second differencing stage arranged to generate a second difference signal by subtracting the first and second feedback signals from the first error signal, and a second filter arranged to generate the second error signal by integrating the second difference signal.

15. A wireless communication device comprising an ADC as claimed in claim 1.

16. A method of analogue-to-digital conversion, comprising:
    in a first continuous-time, CT, delta-sigma, ΔΣ, modulator:
    generating a first error signal dependent on an input signal, a first analogue feedback signal and a second analogue feedback signal,
    generating a first quantised signal by quantising the first error signal into at least three levels at a first sample rate, and
    generating the first analogue feedback signal from the first quantised signal;
    in a second, first order CT ΔΣ modulator:
    generating a second error signal dependent on the first error signal, the first analogue feedback signal and the second analogue feedback signal,
    generating a second quantised signal by quantising the second error signal into two levels at a second sample rate, and
    generating the second analogue feedback signal from the second quantised signal; and
    generating an output signal by summing the first quantised signal and the second quantised signal.

* * * * *